(12) United States Patent
Miyashita et al.

(10) Patent No.: US 11,105,309 B2
(45) Date of Patent: Aug. 31, 2021

(54) CONTROL DEVICE FOR DRIVE SYSTEM

(71) Applicant: TOYOTA JIDOSHA KABUSHIKI KAISHA, Toyota (JP)

(72) Inventors: Michihiro Miyashita, Toyota (JP); Kazuhiko Sakakibara, Toyota (JP); Hiroyuki Toyama, Toyota (JP); Koji Ito, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 16/815,368

(22) Filed: Mar. 11, 2020

(65) Prior Publication Data

US 2020/0332755 A1 Oct. 22, 2020

(30) Foreign Application Priority Data

Apr. 16, 2019 (JP) .............................. JP2019-077715

(51) Int. Cl.
*F02N 11/08* (2006.01)
*G01R 31/392* (2019.01)

(52) U.S. Cl.
CPC ...... *F02N 11/0825* (2013.01); *F02N 11/0862* (2013.01); *G01R 31/392* (2019.01); *F02N 2200/063* (2013.01)

(58) Field of Classification Search
CPC ............. F02N 11/0825; F02N 11/0862; F02N 2200/063; G01R 31/392

USPC ....................................................... 123/179.4
See application file for complete search history.

(56) References Cited

U.S. PATENT DOCUMENTS

| 2011/0180031 A1* | 7/2011 | Hamane | F02N 11/10 |
| | | | 123/179.4 |
| 2015/0292464 A1* | 10/2015 | Maeda | F02N 11/084 |
| | | | 290/38 E |
| 2016/0290270 A1* | 10/2016 | Sato | F02N 11/0862 |

FOREIGN PATENT DOCUMENTS

JP 2009-241633 A 10/2009

* cited by examiner

*Primary Examiner* — Joseph J Dallo
*Assistant Examiner* — Yi-Kai Wang
(74) *Attorney, Agent, or Firm* — Sughrue Mion, PLLC

(57) ABSTRACT

A drive system includes an engine as a drive source, a lead storage battery that is charged using the engine as a motive power source, a starter that starts up the engine by being driven by electric power from the lead storage battery, and a voltage sensor that measures an inter-vehicle voltage of the lead storage battery. A control device that is applied to the drive system determines that the battery has been degraded, when a voltage difference between a first battery start-up voltage and a second battery start-up voltage is larger than a preset degradation determination threshold, the first battery start-up voltage being measured by the voltage sensor when the starter is driven, the second battery start-up voltage being measured by the voltage sensor when the starter is driven at a different timing from a timing when the first battery start-up voltage is measured.

5 Claims, 2 Drawing Sheets

CONTROL DEVICE FOR DRIVE SYSTEM

INCORPORATION BY REFERENCE

The disclosure of Japanese Patent Application No. 2019-077715 filed on Apr. 16, 2019 including the specification, drawings and abstract is incorporated herein by reference in its entirety.

BACKGROUND

1. Technical Field

The disclosure relates to a control device that is applied to a drive system for a vehicle.

2. Description of Related Art

A battery state detection system described in Japanese Patent Application Publication No. 2009-241633 (JP 2009-241633 A) is equipped in a vehicle having a stop-start function. In the battery state detection system, an inter-terminal voltage of a lead storage battery is measured. Then, the internal resistance of the lead storage battery is calculated based on the inter-terminal voltage of the lead storage battery, and the degradation level of the lead storage battery is estimated based on the internal resistance.

SUMMARY

Generally, in a rechargeable battery such as a lead storage battery, as shown by solid lines in FIG. 4, the internal resistance gradually rises with discharge from a full charge state, and in response to the rise in the internal resistance, the inter-terminal voltage also gradually decreases. Further, as shown by the solid lines in FIG. 4, the internal resistance gradually rises with the degradation of the battery, and in response to the rise in the internal resistance, the inter-terminal voltage also gradually decreases. In the battery state detection system as described in JP 2009-241633 A, the degradation level of the lead storage battery is estimated based on the internal resistance, using a phenomenon in which the internal resistance at the time of the full charge and the way of change in the internal resistance due to the discharge vary depending on the degree of the degradation of the battery.

However, depending on a use manner of the battery and the like, in some cases, the internal resistance does not change in the above-described way, despite the degradation of the battery. Specifically, in some cases, although the internal resistance is not much different from the internal resistance when the degradation has not occurred in the state of the full charge, the degradation has occurred actually, so that the dischargeable capacity is small. In this case, as shown by a broken line in FIG. 4, the battery has a battery characteristic that the internal resistance is correspondingly low when the charge amount is near a full charge amount but the internal resistance drastically rises with the discharge. In the battery state detection system described in JP 2009-241633 A, there is no consideration that the characteristic of the battery becomes the above-described characteristic as a result of the degradation of the battery, and it is not possible to appropriately determine such a degradation.

For solving the above problem, the disclosure is a control device that is applied to a drive system for a vehicle, the drive system including an engine as a drive source, a battery that is charged using the engine as a motive power source, a starter that starts up the engine by being driven by electric power from the battery, and a voltage sensor that measures the voltage of the battery, the control device including a degradation determination unit that determines that the battery has been degraded, when a difference between a first battery start-up voltage and a second battery start-up voltage is larger than a preset degradation determination threshold, the first battery start-up voltage being measured by the voltage sensor when the starter is driven, the second battery start-up voltage being measured by the voltage sensor when the starter is driven at a different timing from a timing when the first battery start-up voltage is measured.

With the above configuration, the starter is driven at the time of the start-up of the engine, and the consumed electric power of an electric-powered auxiliary machine other than the starter is likely to be nearly constant. Even if the consumed electric power of the electric-powered auxiliary machine other than the starter differs, the difference is correspondingly small compared to the consumed electric power of the starter. Accordingly, by comparing the start-up voltages of the battery when the starter is driven, it is possible to eliminate influence of the consumed electric power of the electric-powered auxiliary machine, and the like, and to appropriately determine a degradation state of the battery. By determining that the battery has been degraded when the difference between the first battery start-up voltage and the second battery start-up voltage is large, it is possible to determine the degradation of the battery, even when the battery is degraded in a way in which the internal resistance drastically rises with the discharge.

The above control device may include an engine control unit that temporarily stops the engine when a preset temporary stop condition is satisfied in a state where the engine is being driven, in which when the degradation determination unit determines that the battery has been degraded, the engine control unit prohibits the temporary stop of the engine even when the temporary stop condition is satisfied. With the above configuration, when the dischargeable capacity is small due to the degradation of the battery, it is possible to avoid the battery from being excessively discharged while the battery is not charged due to the temporary stop of the engine.

In the above control device, the engine control unit may remove the prohibition of the temporary stop of the engine, when the battery is charged to a charge amount that is larger than a preset charge amount in a prohibition state where the temporary stop of the engine is prohibited.

With the above configuration, when the battery is charged to a charge amount that is larger than the preset charge amount, it is possible to perform the temporary stop of the engine, even when the battery has been degraded. In this case, by removing the prohibition of the temporary stop of the engine, it is possible to increase opportunities of the temporary stop of the engine.

In the above control device, in a provisional-permission state, the engine control unit may prohibit the temporary stop of the engine again, when the difference between the first battery start-up voltage and the second battery start-up voltage is larger than a provisional-permission prohibition threshold, the provisional-permission state being a state where the prohibition of the temporary stop of the engine has been removed in the prohibition state, the provisional-permission prohibition threshold being set to a value that is smaller than the degradation determination threshold.

With the above configuration, once it is determined that the battery has been degraded, the temporary stop of the engine is easily prohibited again, even if the prohibition of the temporary stop of the engine is removed. Accordingly, it is possible to avoid an excessive discharge of the battery, even when the battery is degraded in a way in which the internal resistance of the battery drastically increases.

In the above control device, in a provisional-permission state, the degradation determination unit may determine that the battery has not been degraded, when a state where the difference between the first battery start-up voltage and the second battery start-up voltage is smaller than the degradation determination threshold continues for a preset period, the provisional-permission state being a state where the prohibition of the temporary stop of the engine has been removed in the prohibition state.

With the above configuration, in the case where the degradation determination for the battery is incorrect and where the battery has not been degraded actually or in the case where the degraded battery has been replaced with a new battery, it is determined that the battery has not been degraded. As a result, the battery becomes a state before the temporary stop of the engine is prohibited, and therefore, after it is determined that the battery has not been degraded, the temporary stop of the engine is allowed, so that it is possible to increase opportunities of the temporary stop of the engine.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Hereinafter, an embodiment of a control device that is applied to a drive system for a vehicle will be described with reference to the drawings. First, a whole configuration of the drive system will be described.

Figure 1:
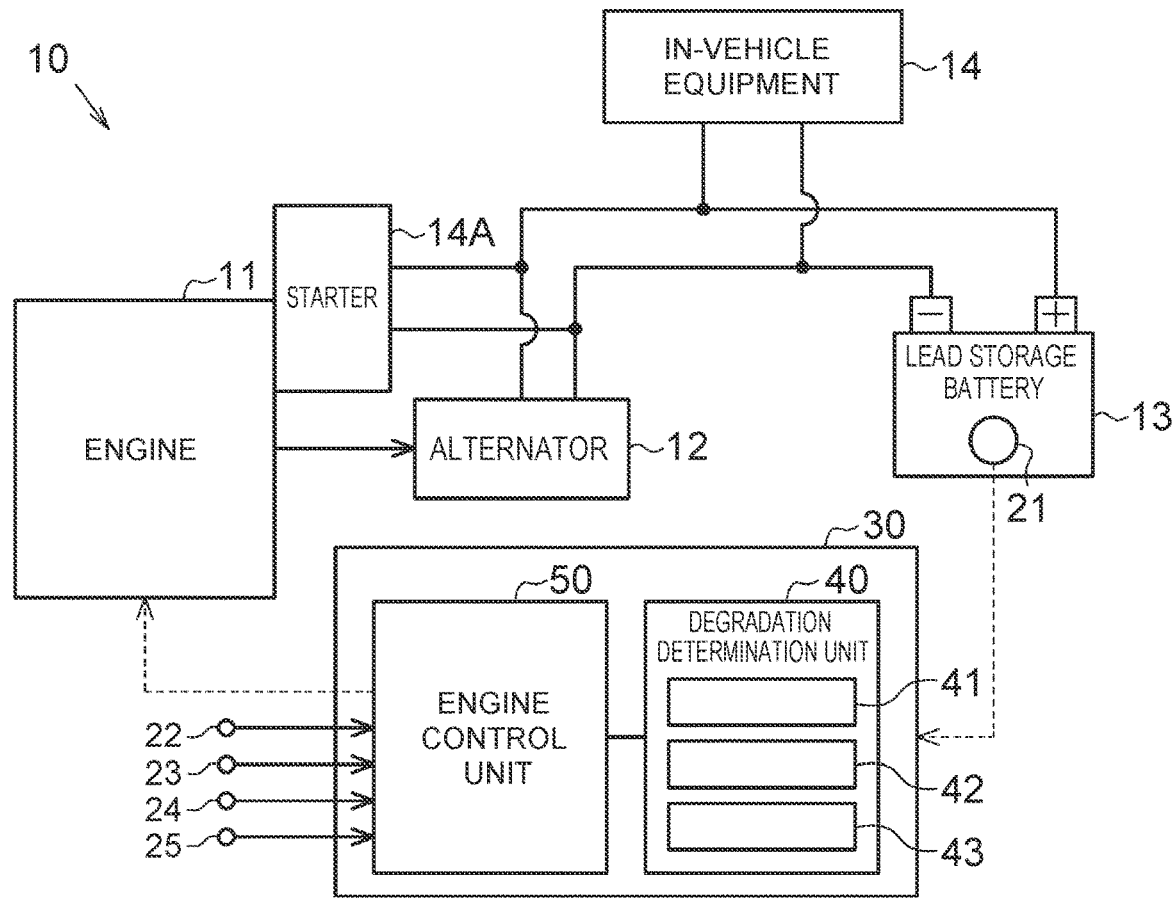
FIG. 1 is a schematic diagram of a drive system.

As shown in FIG. 1, a drive system 10 includes an engine 11 as a drive source of a vehicle. The engine 11 is coupled with an alternator 12 so as to drive the alternator 12. The alternator 12 generates electricity by being driven based on drive torque that is output from the engine 11.

The alternator 12 is electrically connected with a lead storage battery 13 that is charged by electric power generated by the alternator 12. That is, the lead storage battery 13 functions as a battery that is charged using the engine 11 as a drive source. To the lead storage battery 13, a battery sensor 21 is attached. The battery sensor 21 detects the voltage, current and temperature between terminals of the lead storage battery 13. That is, the battery sensor 21 functions as a voltage sensor.

The lead storage battery 13 is electrically connected with in-vehicle equipment 14 that is driven by supply of electric power from the lead storage battery 13. Examples of the in-vehicle equipment 14 includes electric-powered auxiliary machines such as an audio device and an air conditioner that are equipped in the vehicle. Further, the lead storage battery 13 is electrically connected with a starter 14A that starts up the engine 11, as one of the in-vehicle equipment 14. The starter 14A is attached to the engine 11, and when the starter 14A is driven by the electric power from the lead storage battery 13, the engine 11 is started up.

The vehicle includes a control device 30 that is applied to the drive system 10. The control device 30 includes a degradation determination unit 40 that determines the degradation of the lead storage battery 13 based on various signals, and an engine control unit 50 that controls the start-up and stop of the engine 11.

Figure 2:
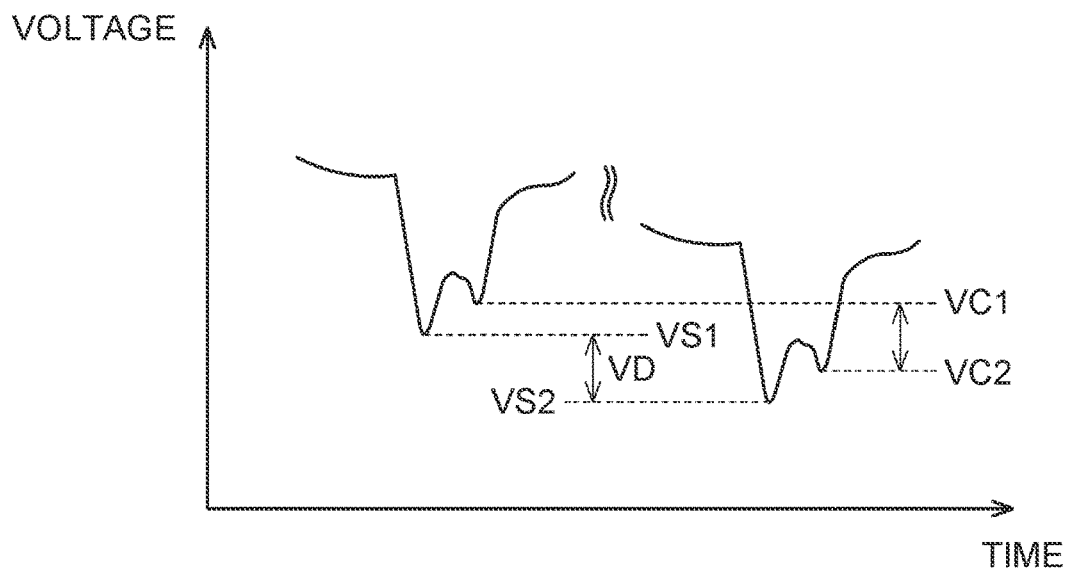
FIG. 2 is a graph showing a change in voltage when a starter is driven.

The degradation determination unit 40 of the control device 30 receives a signal indicating an inter-terminal voltage V of the lead storage battery 13, from the battery sensor 21. Then, a storage unit 41 of the degradation determination unit 40 stores an inrush voltage VS when the engine 11 is started up. As shown in FIG. 2, when the engine control unit 50 starts up the engine 11, the starter 14A is driven by the electric power from the lead storage battery 13. On this occasion, a relatively high current flows, and thereby a relatively great drop occurs in the inter-terminal voltage V of the lead storage battery 13. In the embodiment, the inrush voltage VS is the lowest inter-terminal voltage V of the lead storage battery 13 when the starter 14A is driven.

As shown in FIG. 1, the storage unit 41 of the degradation determination unit 40 stores the inrush voltage VS, whenever the starter 14A is driven. In the embodiment, the storage unit 41 stores two past inrush voltages VS. Further, the storage unit 41 erases the earlier one of the inrush voltages VS, when the storage unit 41 stores a new inrush voltage VS.

A calculation unit 42 of the degradation determination unit 40 sets the earlier one of the two past inrush voltages VS stored in the storage unit 41, as a first battery start-up voltage VS1, and sets the later one as a second battery start-up voltage VS2. Then, the calculation unit 42 calculates a voltage difference VD that is the absolute value of the difference between the two. That is, as shown in FIG. 2, the voltage difference VD is the difference between the first battery start-up voltage VS1 when the starter 14A is driven and the second battery start-up voltage VS2 when the starter 14A is driven at a different timing from the timing when the first battery start-up voltage VS1 is measured.

As shown in FIG. 1, in the case where the voltage difference VD calculated by the calculation unit 42 is larger than a preset degradation determination threshold VDL1, a determination unit 43 of the degradation determination unit 40 determines that the lead storage battery 13 has been degraded. By a test or the like, the degradation determination threshold VDL1 is previously set to a voltage value allowing the detection of a voltage decrease due to the rise in the internal resistance when the lead storage battery 13 has been degraded such that the internal resistance drastically rises with the discharge as shown by the broken line in FIG. 4.

As shown in FIG. 1, the engine control unit 50 of the control device 30 receives information indicating the operation amount of an accelerator pedal, from an accelerator pedal sensor 22 that detects the operation amount of the accelerator pedal. Further, the engine control unit 50 receives information indicating a vehicle speed that is the traveling speed of the vehicle, from a vehicle speed sensor 23 that detects the vehicle speed. Furthermore, the engine control unit 50 receives information indicating whether a brake pedal is being operated, from a brake pedal sensor 24 that detects whether the brake pedal is being operated. Further, the engine control unit 50 receives a signal indicating an on-state or off-state of an ignition switch 25 that is used when the stopped engine 11 is driven.

When a preset execution condition is satisfied in a state where the engine 11 is being driven, the engine control unit 50 temporarily stops the engine 11 that is being driven. For example, the execution condition of the temporary stop of the engine 11 is satisfaction of all of a condition that the operation amount of the accelerator pedal is zero, a condition that the vehicle speed is zero, and a condition that the brake pedal is being operated. When the execution condition is satisfied, the engine control unit 50 temporarily stops the engine 11, and when the satisfaction of the execution condition is terminated during the temporary stop of the engine 11, the engine control unit 50 starts up the engine 11 again by driving the starter 14A.

Figure 4:
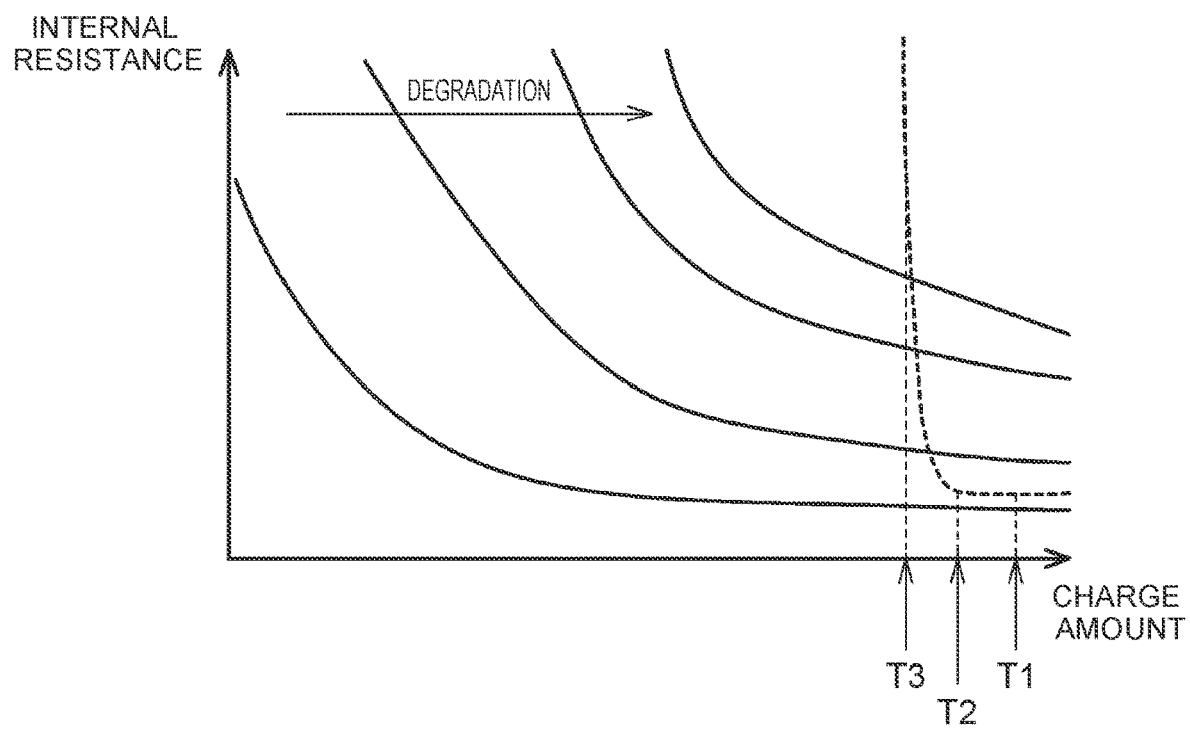
FIG. 4 is a graph showing a change in internal resistance with respect to charge amount due to degradation.

The engine control unit 50 calculates a charge amount SOC of the lead storage battery 13, based on the inter-terminal voltage V, current and temperature of the lead storage battery 13 that are input to the control device 30. In the embodiment, the charge amount SOC is the amount of electricity that can be discharged by the lead storage battery 13. That is, in the case of a full charge, the charge amount SOC when the lead storage battery 13 has been degraded is smaller than the charge amount SOC when the lead storage battery 13 has not been degraded. For convenience of description, FIG. 4 illustrates characteristics of batteries having different states, in which the full charge is shown on the extreme right. Accordingly, the charge amount SOC in the full charge state varies among batteries having different states.

Figure 3:
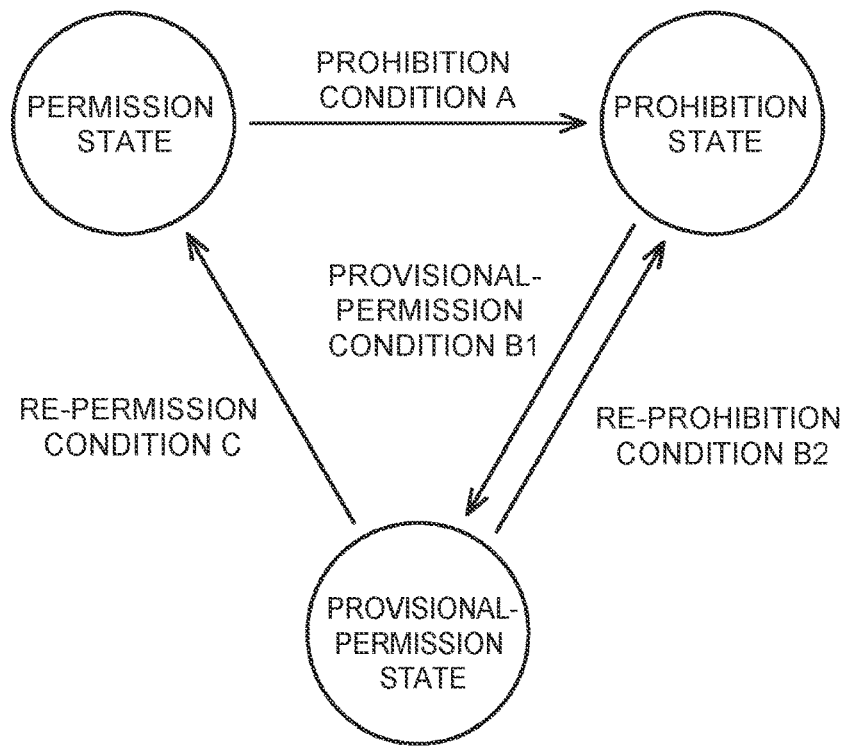
FIG. 3 is a diagram showing a relation of a permission state, a prohibition state and a provisional-permission state in a control mode of an engine.

As shown in FIG. 3, the engine control unit 50 switches a control mode relevant to the permission or prohibition of the temporary stop of the engine 11, to one of a permission state where the temporary stop of the engine 11 can be performed, a prohibition state where the temporary stop of the engine 11 is prohibited, and a provisional-permission state where the temporary stop of the engine 11 is provisionally permitted.

In the case where the degradation determination unit 40 determines that the lead storage battery 13 has not been degraded, the engine control unit 50 puts the control mode of the engine 11 into the permission state. Further, in the case where a prohibition condition A is satisfied when the control mode of the engine 11 is the permission state, the engine control unit 50 puts the control mode of the engine 11 into the prohibition state. The engine control unit 50 determines whether the prohibition condition A is satisfied, whenever the starter 14A is driven. The prohibition condition A is a condition that the degradation determination unit 40 determines that the lead storage battery 13 has been degraded.

In the case where a provisional-permission condition B1 is satisfied when the control mode of the engine 11 is the prohibition state, the engine control unit 50 puts the control mode of the engine 11 into the provisional-permission state. The engine control unit 50 determines whether the provisional-permission condition B1 is satisfied, whenever the starter 14A is driven. When the control mode of the engine 11 transitions from the prohibition state to the provisional-permission state, the prohibition of the temporary stop of the engine 11 is removed. Although the control mode of the engine 11 transitions from the prohibition state to the provisional-permission state, it is not determined that the lead storage battery 13 has not been degraded, and therefore, the determination that the lead storage battery 13 has been degraded is kept.

The provisional-permission condition B1 is a condition that the number of times of switching of the ignition switch 25 from an off-state to an on-state, that is, a so-called trip number becomes a preset number N. In the case where the ignition switch 25 is switched from the off-state to the on-state when the control mode of the engine 11 is the prohibition state, it is estimated that the engine 11 is driven and the lead storage battery 13 is charged. When the engine 11 is driven for a long period while the temporary stop of the engine 11 is prohibited, it is estimated that the charge amount SOC of the lead storage battery 13 becomes large. Hence, in the embodiment, in the case where the number of times of the switching of the ignition switch 25 from the off-state to the on-state is equal to or larger than the preset number N when the control mode of the engine 11 is the prohibition state, it is regarded that the charge amount SOC of the lead storage battery 13 is equal to or larger than a preset specified charge amount SOCL. The specified charge amount SOCL is previously calculated by a test or the like, as a charge amount SOC necessary to secure a certain charge amount SOC as the charge amount SOC of the lead storage battery 13 even after the engine 11 is started up again during the temporary stop of the engine 11. Further, the number N is previously set by a test or the like, to the number of trip periods necessary to charge the lead storage battery 13 to the specified charge amount SOC, assuming that one trip period for which the ignition switch 25 is switched from the off-state to the on-state and then is switched to the off-state again is a preset constant period.

In the case where a re-prohibition condition B2 is satisfied when the control mode of the engine 11 is the provisional-permission state, the engine control unit 50 puts the control mode of the engine 11 into the prohibition state. The engine control unit 50 determines whether the re-prohibition condition B2 is satisfied, whenever the starter 14A is driven. When the control mode of the engine 11 transitions from the provisional-permission state to the prohibition state, the temporary stop of the engine 11 is prohibited again. The re-prohibition condition B2 is a condition that the voltage difference VD calculated by the calculation unit 42 of the degradation determination unit 40 is larger than a re-prohibition threshold VDL2 that is set to a value smaller than the degradation determination threshold VDL1. In this way, the provisional-permission state is different from the permission state, in that the control mode of the engine 11 easily transitions to the prohibition state again although the temporary stop of the engine 11 is permitted.

In the case where a re-permission condition C is satisfied when the control mode of the engine 11 is the provisional-permission state, the engine control unit 50 permits the temporary stop of the engine 11 again. The engine control unit 50 determines whether the re-permission condition C is satisfied, whenever the starter 14A is driven. The re-permission condition C is a condition that the degradation determination unit 40 determines that the lead storage battery 13 has been degraded.

When the control mode of the engine 11 is the provisional-permission state, the degradation determination unit 40 determines whether the degradation of the lead storage battery 13 has been resolved. A condition for the determination that the degradation of the lead storage battery 13 has been resolved is a condition that the determination of the non-satisfaction of the re-prohibition condition B2, which is repeatedly determined when the control mode of the engine 11 is the provisional-permission state, is made continuously to a preset number M. In other words, the condition for the determination that the degradation of the lead storage battery 13 has been resolved and the lead storage battery 13 has not been degraded is a condition that a state where the voltage difference VD is smaller than the re-prohibition threshold VDL2 continues for a fixed period. The number M is obtained, by dividing a period that is previously set as a period allowing confirmation that the lead storage battery 13 has not been degraded, for example, a period of several hours to several tens of hours, by a period that is previously set as the one trip period.

Next, the operation of the degradation determination for the lead storage battery 13 by the degradation determination unit 40 and the operation of the switching process for the control mode of the engine 11 by the engine control unit 50 will be described. In the following description, it is assumed that the discharge amount of the lead storage battery 13 increases and the charge amount SOC decreases as time passes from timing T1 to timing T3. Further, as shown by the broken line in FIG. 4, the lead storage battery 13 has been degraded, and has a characteristic that the internal resistance drastically increases with the discharge although the difference in the internal resistance from the lead storage battery 13 that has not been degraded is small in a nearly full charge state.

Suppose that the starter 14A is driven at timing T1 when the charge amount SOC of the lead storage battery 13 is a nearly full charge amount, and then, after the stop of the engine 11, the starter 14A is driven again at timing T2, as shown in FIG. 4. On this occasion, as shown by the broken line in FIG. 4, if a corresponding charge amount SOC remains as the charge amount SOC of the lead storage battery 13 at timing T2, the internal resistance of the lead storage battery 13 at timing T2 is nearly the same as that at timing T1. Accordingly, the first battery start-up voltage VS1 that is the inrush voltage VS when the starter 14A is driven at timing T1 is nearly the same as the second battery start-up voltage VS2 that is the inrush voltage VS when the starter 14A is driven at timing T2, and the voltage difference VD between the two is nearly zero. As a result, at timing T2, the degradation determination unit 40 determines that the lead storage battery 13 has not been degraded. Therefore, the engine control unit 50 keeps the permission state as the control mode of the engine 11.

Suppose that the starter 14A is driven again at timing T3 after timing T2. On this occasion, as shown by the broken line in FIG. 4, if the charge amount SOC of the lead storage battery 13 is small at timing T3, the internal resistance of the lead storage battery 13 drastically becomes larger than that at timing T2. Accordingly, the voltage difference VD between the first battery start-up voltage VS1 that is the inrush voltage VS when the starter 14A is driven at timing T2 and the second battery start-up voltage VS2 that is the inrush voltage VS when the starter 14A is driven at timing T3 is larger than the degradation determination threshold VDL1. As a result, at timing T3, the degradation determination unit 40 determines that the lead storage battery 13 has been degraded. Since the degradation determination unit 40 determines that the lead storage battery 13 has been degraded, the prohibition condition A is satisfied, and the control mode of the engine 11 is switched from the permission state to the prohibition state, as shown in FIG. 3.

In the case where the control mode of the engine 11 is the prohibition state, the temporary stop of the engine 11 is prohibited, and the drive of the engine 11 is continued. Therefore, the charge amount SOC of the lead storage battery 13 increases as a whole. Then, when the trip number in the state where the temporary stop of the engine 11 is prohibited becomes larger than the number N and thereby the charge amount SOC of the lead storage battery 13 becomes larger than the specified charge amount SOCL, the engine control unit 50 switches the control mode of the engine 11 from the prohibition state to the provisional-permission state.

In the case where the control mode of the engine 11 is the provisional-permission state, the temporary stop of the engine 11 is provisionally permitted, and the drive of the engine 11 is temporarily stopped. Therefore, the charge amount SOC of the lead storage battery 13 decreases as a whole. Then, when the charge amount SOC of the lead storage battery 13 decreases and the internal resistance of the lead storage battery 13 correspondingly becomes high, that is, when the voltage difference VD becomes larger than the re-prohibition threshold VDL2, the engine control unit 50 switches the control mode of the engine 11 from the provisional-permission state to the prohibition state.

Suppose that the degraded lead storage battery 13 is replaced with a new lead storage battery 13 in the case where the control mode of the engine 11 is the provisional-permission state. In the lead storage battery 13 that has not been degraded, the internal resistance does not drastically change, even when the charge amount SOC changes. Therefore, in the case where the degraded lead storage battery 13 is replaced with a new lead storage battery 13, the voltage difference VD does not become equal to or smaller than the re-prohibition threshold VDL2, and the state where the voltage difference VD is larger than the re-prohibition threshold VDL2 continues. As a result, it is determined that the lead storage battery 13 has not been degraded, and the control mode of the engine 11 is switched from the provisional-permission state to the permission state.

In the above description, it is assumed that the charge amount SOC of the lead storage battery 13 decreases as time passes from timing T1 to timing T3. However, even in the case where the charge amount SOC of the lead storage battery 13 rises as time passes, the control mode is switched from the permission state to the prohibition state, when the voltage difference VD becomes larger than the re-prohibition threshold VDL2.

Next, effects of the embodiment will be described. In the embodiment, the starter 14A is driven at the time of the start-up of the engine 11, and the consumed electric power of the in-vehicle equipment 14 other than the starter 14A is likely to be nearly constant. Even if the consumed electric power of the in-vehicle equipment 14 other than the starter 14A differs, the difference is correspondingly small compared to the consumed electric power of the starter 14A. Accordingly, by comparing the inrush voltages VS of the lead storage battery 13 when the starter 14A is driven, it is possible to eliminate influence of the consumed electric power of the in-vehicle equipment 14, and the like, and to appropriately determine the degradation state of the lead storage battery 13. By determining that the lead storage battery 13 has been degraded when the difference between the first battery start-up voltage VS1 and the second battery start-up voltage VS2 is large, it is possible to determine the degradation of the lead storage battery 13, even when the lead storage battery 13 is degraded in a way in which the internal resistance drastically rises with the discharge.

In the embodiment, in the case where it is determined that the lead storage battery 13 has been degraded, the control mode of the engine 11 is switched to the prohibition state, and the temporary stop of the engine 11 is prohibited. Accordingly, in the case where the dischargeable capacity is small due to the degradation of the lead storage battery 13, it is possible to avoid the lead storage battery 13 from being excessively discharged while the lead storage battery 13 is not charged due to the temporary stop of the engine 11.

In the embodiment, even after the control mode of the engine 11 is switched to the prohibition state, the control mode is switched to the provisional-permission state and the temporary stop of the engine 11 is permitted, when the lead storage battery 13 is charged to a charge amount that is larger than the preset specified charge amount SOCL. Therefore, even when the lead storage battery 13 has been degraded, it is possible to perform the temporary stop of the engine 11, depending on the charge amount SOC of the lead storage battery 13. By removing the prohibition of the temporary stop of the engine 11 in this way, it is possible to increase opportunities of the temporary stop of the engine 11.

In the embodiment, once it is determined that the lead storage battery 13 has been degraded, the temporary stop of the engine 11 is easily prohibited again, even if the control mode is switched to the provisional-permission state and the prohibition of the temporary stop of the engine 11 is removed. Accordingly, it is possible to avoid an excessive discharge of the lead storage battery 13, even when the lead storage battery 13 is degraded in a way in which the internal resistance of the lead storage battery 13 drastically increases.

In the embodiment, in the case where the degradation determination for the lead storage battery 13 is incorrect and where the lead storage battery 13 has not been degraded actually or in the case where the degraded lead storage battery 13 has been replaced with a new lead storage battery 13, it is determined that the lead storage battery 13 has not been degraded. As a result, the lead storage battery 13 becomes a state before the temporary stop of the engine 11 is prohibited, and therefore, after it is determined that the lead storage battery 13 has not been degraded, the temporary stop of the engine 11 is allowed, so that it is possible to increase opportunities of the temporary stop of the engine 11.

The above embodiment can be carried out while being modified described below. The embodiment and the following modifications can be carried out while being combined in a range in which there is no technical inconsistency. The kind of the battery is not limited to the lead storage battery 13. A battery having a characteristic that in the case where the charge amount SOC becomes small due to the degradation of the battery, the internal resistance hardly changes in a nearly full charge state and the internal resistance drastically changes as the charge amount SOC becomes smaller can be applied to the battery in the above embodiment.

The control device 30 does not need to perform the switching process for the control mode relevant to the temporary stop of the engine 11. In this case, when the degradation determination unit 40 determines that the lead storage battery 13 has been degraded, it is allowable to perform a process of reminding a driver by lighting an indicator lamp of the vehicle. The process of lighting the indicator lamp may be performed, in addition to the process for the switching of the control mode of the engine 11. Further, when the degradation determination unit 40 determines that the lead storage battery 13 has been degraded, it is allowable to perform a process of restricting the amount of electricity that is supplied to the in-vehicle equipment 14. The process of restricting the amount of electricity that is supplied to the in-vehicle equipment 14 may be performed, in addition to the process for the switching of the control mode of the engine 11.

The condition for determining that the provisional-permission condition B1 is satisfied is not limited to the example of the above embodiment. For example, the charge amount SOC of the lead storage battery 13 may be calculated, and it may be determined that the provisional-permission condition B1 is satisfied, when the calculated charge amount SOC is equal to or larger than the specified charge amount SOCL.

The control device 30 may exclude the provisional-permission state in the control mode of the engine 11, and the control mode may be configured by only the two kinds of the permission state and the prohibition state. In this case, for example, when the degradation determination unit 40 determines that the lead storage battery 13 has been degraded, the control device 30 may keep the prohibition state as the control mode of the engine 11, unless the control mode is reset in a maintenance factory or the like at the time of the replacement of the lead storage battery 13.

The control device 30 does not need to switch the control mode of the engine 11 from the provisional-permission state to the permission state. In this case, once it is determined that the lead storage battery 13 has been degraded, the control mode of the engine 11 is switched to the prohibition state or the provisional-permission state. Then, the control mode is switched to the permission mode, when the control mode is reset in a maintenance factory or the like at the time of the replacement of the lead storage battery 13.

The re-permission condition C is not limited to the example of the above embodiment. For example, the re-permission condition C may be a condition that the re-prohibition condition B2 is not satisfied for a preset fixed period, or may be a condition that the prohibition condition A is not satisfied for a preset fixed period. In this case, a timer measures a time during which the re-prohibition condition B2 is not satisfied, and it is determined that the re-permission condition C is satisfied, when the time exceeds a fixed period that is previously set by a test or the like. The re-permission condition C only needs to be at least a condition that a state where the voltage difference VD is smaller than the degradation determination threshold VDL1 continues for a preset period.

The battery sensor 21 is not limited to the example of the above embodiment. A voltage sensor that measures the inter-terminal voltage V of the lead storage battery 13, a current sensor that measures the current, and a temperature sensor that measures the temperature may be provided separately. It is only necessary to measure at least the inter-terminal voltage V of the lead storage battery 13.

Each of the first battery start-up voltage VS1 and the second battery start-up voltage VS2 does not need to be the inrush voltage VS. For example, as shown in FIG. 2, when the starter 14A is driven, the inter-terminal voltage V of the lead storage battery 13 instantaneously drops to the inrush voltage VS. Thereafter, as a reaction, the inter-terminal voltage V rises, but the inter-terminal voltage V decreases again, to become a local minimum value. The local minimum value is defined as a cranking voltage VC when the starter 14A is cranking the engine 11. Then, a cranking voltage VC1 when the starter 14A is driven may be set as the first battery start-up voltage, a cranking voltage VC2 when the starter 14A is driven at a different timing from the timing for the first battery start-up voltage may be set as the second battery start-up voltage, and the degradation of the lead storage battery 13 may be determined. Furthermore, for example, an average voltage after the inrush voltage VS and before the cranking voltage VC can be employed as the battery start-up voltage.

The first battery start-up voltage and the second battery start-up voltage do not need to be stored whenever the starter 14A is driven. The second battery start-up voltage may be stored, for example, when the starter 14A is driven after a fixed amount of charge-discharge has been performed or a fixed period has elapsed since the last drive of the starter 14A.

What is claimed is:

1. A controller that is applied to a drive system for a vehicle, the drive system comprising:
an engine as a drive source;
a battery that is charged using the engine as a motive power source;
a starter that starts up the engine by being driven by electric power from the battery; and
a voltage sensor that measures a voltage of the battery,
the controller being configured to determine that the battery has been degraded, based on a difference between a first start-up voltage of the battery and a second start-up voltage of the battery being larger than a preset degradation determination threshold,
wherein the first start-up voltage of the battery is measured by the voltage sensor when the starter is driven at a first time, and the second start-up voltage of the battery is measured by the voltage sensor when the starter is driven at a second time that is different than the first time.

2. The controller according to claim 1, wherein the controller is further configured to:
temporarily stop the engine when a preset temporary stop condition is satisfied in a state where the engine is being driven, and
based on determining that the battery has been degraded, prohibit the temporary stop of the engine even when the temporary stop condition is satisfied.

3. The controller according to claim 2, wherein the controller is further configured to remove the prohibition of the temporary stop of the engine, based on the battery being charged to a charge amount that is larger than a preset charge amount of a prohibition state where the temporary stop of the engine is prohibited.

4. The controller according to claim 3, wherein the controller is further configured to, based on being in a provisional-permission state and the difference between the first start-up voltage of the battery and the second battery start-up voltage being larger than a provisional-permission prohibition threshold, prohibit the temporary stop of the engine,
wherein the provisional-permission state is a state where the prohibition of the temporary stop of the engine has been removed in the prohibition state, and
wherein the provisional-permission prohibition threshold is set to a value that is smaller than the preset degradation determination threshold.

5. The controller according to claim 3, wherein the controller is further configured to, based on being in a provisional-permission state and being in a state where the difference between the first battery start-up voltage and the second start-up voltage of the battery is smaller than the preset degradation determination threshold continues for a preset period, determine that the battery has not been degraded,
wherein the provisional-permission state is a state where the prohibition of the temporary stop of the engine has been removed in the prohibition state.

* * * * *